(12) United States Patent
Cowles et al.

(10) Patent No.: US 7,378,290 B2
(45) Date of Patent: May 27, 2008

(54) ISOLATION CIRCUIT

(75) Inventors: Timothy B. Cowles, Boise, ID (US); Aron T. Lunde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/929,898

(22) Filed: Aug. 30, 2004

(65) Prior Publication Data
US 2005/0026315 A1    Feb. 3, 2005

Related U.S. Application Data

(62) Division of application No. 10/176,015, filed on Jun. 20, 2002.

(51) Int. Cl.
*H01L 21/66* (2006.01)
(52) U.S. Cl. .............................. 438/18; 438/14; 438/17; 438/53; 438/107; 438/110; 438/11; 438/12; 438/460; 438/462; 257/E21.521
(58) Field of Classification Search .................. 438/18, 438/14, 17, 53, 107, 110, 11, 12, 460, 462; 324/765; 257/E21.521
See application file for complete search history.

(56) References Cited

U.S. PATENT DOCUMENTS

| | | | |
|---|---|---|---|
| 3,721,838 A | 3/1973 | Brickman et al. .......... 307/303 |
| 3,781,683 A | 12/1973 | Freed | |
| 4,379,259 A | 4/1983 | Varadi et al. ................. 324/73 |
| 4,458,297 A | 7/1984 | Stopper et al. | |
| 4,467,400 A | 8/1984 | Stopper | |
| 4,479,088 A | 10/1984 | Stopper | |
| 4,689,494 A | 8/1987 | Chen ...................... 307/202.1 |
| 4,752,929 A | 6/1988 | Kant et al. | |
| 4,791,319 A | 12/1988 | Tagami et al. .............. 307/441 |
| 4,812,742 A | 3/1989 | Abel et al. | |
| 4,847,810 A | 7/1989 | Tagami ....................... 365/200 |
| 4,918,379 A | 4/1990 | Jongepier | |
| 4,961,053 A | 10/1990 | Krug et al. | |
| 4,970,454 A | 11/1990 | Stambaugh et al. | |
| 5,059,835 A | 10/1991 | Lauffer et al. .............. 307/576 |
| 5,059,899 A * | 10/1991 | Farnworth et al. ............. 438/18 |
| 5,099,149 A | 3/1992 | Smith ......................... 307/465 |
| 5,301,143 A | 4/1994 | Ohri et al. .................... 365/96 |
| 5,301,159 A | 4/1994 | Lee .......................... 365/225.7 |
| 5,424,672 A | 6/1995 | Cowles et al. .............. 327/525 |
| 5,442,282 A | 8/1995 | Rostoker ................. 324/158.1 |
| 5,446,695 A | 8/1995 | Douse et al. ................ 365/222 |

(Continued)

OTHER PUBLICATIONS

Weste et al., Principles of CMOS VLSI Design, Addison Wesley, pp. 7-8.*

(Continued)

*Primary Examiner*—Lynne Gurley
*Assistant Examiner*—Junghwa Im
(74) *Attorney, Agent, or Firm*—Schwegman, Lundberg & Woessner, P.A.

(57) ABSTRACT

An isolation circuit includes a first pad adapted to receive a control signal and a second pad adapted to receive another signal. A third pad is coupled to a microelectronic die and a device is provided to transfer the other signal from the second pad to the third pad in response to the control signal.

26 Claims, 13 Drawing Sheets

U.S. PATENT DOCUMENTS

| | | | |
|---|---|---|---|
| 5,457,659 A | 10/1995 | Schaefer | 365/222 |
| 5,469,393 A | 11/1995 | Thomann | 365/201 |
| 5,485,031 A | 1/1996 | Zhang et al. | 257/530 |
| 5,485,032 A | 1/1996 | Schepis et al. | 257/530 |
| 5,486,707 A | 1/1996 | Look et al. | 257/52 |
| 5,486,776 A | 1/1996 | Chiang | 326/41 |
| 5,490,042 A | 2/1996 | Perkins | 361/778 |
| 5,495,181 A | 2/1996 | Kolze | 326/38 |
| 5,495,436 A | 2/1996 | Callahan | 365/96 |
| 5,498,895 A | 3/1996 | Chen | 257/355 |
| 5,500,588 A | 3/1996 | Worley | 324/158.1 |
| 5,502,000 A | 3/1996 | Look et al. | 437/60 |
| 5,502,333 A | 3/1996 | Bertin et al. | 257/685 |
| 5,502,668 A | 3/1996 | Shimoji et al. | 365/185.28 |
| 5,502,674 A | 3/1996 | Griffus et al. | 365/200 |
| 5,506,518 A | 4/1996 | Chiang | 326/41 |
| 5,508,638 A | 4/1996 | Cowles et al. | 326/38 |
| 5,537,108 A | 7/1996 | Nathan et al. | 340/825.84 |
| 5,539,325 A | 7/1996 | Rostoker et al. | 324/763 |
| 5,548,560 A | 8/1996 | Stephens, Jr. et al. | 365/233.5 |
| 5,594,694 A | 1/1997 | Roohparvar et al. | 365/201 |
| 5,648,661 A | 7/1997 | Rostoker et al. | 257/48 |
| 5,648,730 A | 7/1997 | Bhuva et al. | 324/763 |
| 5,661,690 A | 8/1997 | Roohparvar | 365/201 |
| 5,679,609 A | 10/1997 | Aimi et al. | 437/205 |
| 5,696,404 A * | 12/1997 | Murari et al. | 257/620 |
| 5,706,235 A | 1/1998 | Roohparvar et al. | 365/201 |
| 5,726,482 A | 3/1998 | Nathan et al. | 257/529 |
| 5,734,661 A | 3/1998 | Roberts et al. | 371/22.5 |
| 5,754,486 A | 5/1998 | Nevill et al. | 365/201 |
| 5,757,705 A | 5/1998 | Manning | 365/201 |
| 5,809,038 A | 9/1998 | Martin | 371/21.2 |
| 5,838,163 A | 11/1998 | Rostoker et al. | 324/763 |
| 5,848,018 A | 12/1998 | McClure | 365/201 |
| 5,896,400 A | 4/1999 | Roohparvar et al. | 371/22.1 |
| 5,956,567 A | 9/1999 | Tomita et al. | |
| 5,966,021 A | 10/1999 | Eliashberg et al. | 324/760 |
| 5,994,915 A | 11/1999 | Farnworth et al. | 324/765 |
| 5,995,426 A | 11/1999 | Cowles et al. | 365/201 |
| 5,996,096 A | 11/1999 | Dell et al. | 714/710 |
| 6,025,730 A | 2/2000 | Akram et al. | 324/758 |
| 6,052,321 A | 4/2000 | Roohparvar | 365/201 |
| 6,094,377 A | 7/2000 | Roohparvar et al. | 365/189.05 |
| 6,094,388 A | 7/2000 | Cowles | 365/201 |
| 6,104,651 A | 8/2000 | Cowles et al. | 365/201 |
| 6,114,878 A | 9/2000 | Loughmiller et al. | 326/101 |
| 6,121,677 A | 9/2000 | Song et al. | |
| 6,130,811 A | 10/2000 | Gans et al. | 361/56 |
| 6,133,582 A | 10/2000 | Osann, Jr. et al. | |
| 6,204,678 B1 | 3/2001 | Akram et al. | 324/758 |
| 6,228,684 B1 | 5/2001 | Maruyama | 438/113 |
| 6,246,250 B1 | 6/2001 | Doherty et al. | 324/765 |
| 6,275,058 B1 | 8/2001 | Lunde | 324/765 |
| 6,300,786 B1 | 10/2001 | Doherty et al. | 324/765 |
| 6,313,658 B1 | 11/2001 | Farnworth et al. | 324/765 |
| 6,337,577 B1 | 1/2002 | Doherty et al. | 324/765 |
| 6,362,087 B1 | 3/2002 | Wang et al. | 438/597 |
| 6,365,443 B1 | 4/2002 | Hagiwara et al. | |
| 6,366,112 B1 | 4/2002 | Doherty et al. | 324/765 |
| 6,366,766 B1 | 4/2002 | Dalebroux | 455/217 |
| 6,396,300 B1 | 5/2002 | Loughmiller et al. | 326/16 |
| 6,417,695 B1 | 7/2002 | Duesman | 326/47 |
| 6,433,574 B1 | 8/2002 | Doherty et al. | 324/765 |
| 6,459,290 B1 | 10/2002 | Nishikawa et al. | |
| 6,462,575 B1 | 10/2002 | Cram | |
| 6,466,047 B1 | 10/2002 | Doherty et al. | 324/765 |
| 6,472,239 B2 | 10/2002 | Hembree et al. | 438/18 |
| 6,484,279 B2 | 11/2002 | Akram | 714/724 |
| 6,522,161 B2 | 2/2003 | Lunde | 324/765 |
| 6,525,982 B1 | 2/2003 | Cowles | 365/225.7 |
| 6,538,264 B2 | 3/2003 | Corbett et al. | |
| 6,545,510 B1 | 4/2003 | Cowles | 327/74 |
| 6,577,148 B1 | 6/2003 | DeHaven et al. | |
| 6,590,225 B2 * | 7/2003 | Whetsel et al. | 257/48 |
| 6,605,861 B2 | 8/2003 | Toyoda | |
| 6,630,685 B1 | 10/2003 | Lunde | 257/691 |
| 6,640,323 B2 | 10/2003 | Akram | 714/734 |
| 6,714,031 B2 | 3/2004 | Seki | |
| 6,763,282 B2 * | 7/2004 | Glenn et al. | 700/245 |
| 6,809,378 B2 | 10/2004 | Byrd et al. | |
| 6,836,133 B2 | 12/2004 | Kinoshita | |
| 6,838,891 B2 | 1/2005 | Ohya et al. | |
| 6,844,218 B2 * | 1/2005 | Potts | 438/110 |
| 6,844,751 B2 | 1/2005 | Marshall et al. | |
| 6,967,348 B2 | 11/2005 | Cowles et al. | |
| 2001/0027549 A1 | 10/2001 | Cowles | 714/734 |
| 2002/0130687 A1 | 9/2002 | Duesman | 326/101 |
| 2002/0133767 A1 | 9/2002 | Cowles | 714/719 |
| 2002/0133769 A1 | 9/2002 | Cowles et al. | 714/719 |
| 2002/0133770 A1 | 9/2002 | Cowles | 714/723 |
| 2003/0063056 A1 | 4/2003 | Frazee et al. | 345/87 |
| 2003/0086318 A1 | 5/2003 | Cowles | 365/200 |
| 2003/0124816 A1 | 7/2003 | Potts | 438/462 |
| 2003/0137030 A1 | 7/2003 | Lunde | 257/620 |
| 2006/0131577 A1 | 6/2006 | Cowles et al. | |

OTHER PUBLICATIONS

Non-Final Office Action mailed Jan. 27, 2004 in U.S. Appl. No. 10/176,015, now U.S. Patent No. 7,026,646, 16 pgs.
Response to Non-Final Office Action mailed Apr. 27, 2004 in U.S. Appl. No. 10/176,015, now U.S. Patent No. 7,026,646, 18 pgs.
Final Office Action mailed Jul. 13, 2004 in U.S. Appl. No. 10/176,015, now U.S. Patent No. 7,026,646, 20 pgs.
Response to Final Office Action mailed Nov. 15, 2004 in U.S. Appl. No. 10/176,015, now U.S. Patent No. 7,026,646, 19 pgs.
Advisory Action mailed Dec. 10, 2004 in U.S. Appl. No. 10/176,015, now U.S. Patent No. 7,026,646, 3 pgs.
Appeal Brief mailed May 18, 2005 in U.S. Appl. No. 10/176,015, now U.S. Patent No. 7,026,646, 36 pgs.
Notice of Allowance mailed Nov. 7, 2005 in U.S. Appl. No. 10/176,015, now U.S. Patent No. 7,026,646, 6 pgs.
Non-Final Office Action mailed Aug. 6, 2003 in U.S. Appl. No. 10/176,330 now U.S. Patent No. 6,967,348, 8 pgs.
Amendment and Response to Non-Final Office Action mailed Dec. 8, 2003 in U.S. Appl. No. 10/176,330 now U.S. Patent No. 6,967,348, 24 pgs.
Final Office Action mailed Jun. 22, 2004 in U.S. Appl. No. 10/176,330 now U.S. Patent No. 6,967,348, 12 pgs.
Amendment and Response to Final Office Action mailed Sep. 22, 2004 in U.S. Appl. No. 10/176,330 now U.S. Patent No. 6,967,348, 21 pgs.
Non-Final Office Action mailed Dec. 15, 2004 in U.S. Appl. No. 10/176,330 now U.S. Patent No. 6,967,348, 8 pgs.
Amendment and Response to Non-Final Office Action mailed Mar. 15, 2005 in U.S. Appl. No. 10/176,330 now U.S. Patent No. 6,967,348, 20 pgs.
Notice of Allowance mailed Aug. 6, 2003 in U.S. Appl. No. 10/176,330 now U.S. Patent No. 6,967,348, 6 pgs.

* cited by examiner

ISOLATION CIRCUIT

This application is a Divisional of U.S. application Ser. No. 10/176,015, filed Jun. 20, 2002 which is incorporated herein by reference.

FIELD OF THE INVENTION

The present invention relates generally to microelectronic dies, semiconductor chips and the like, and more particularly to an isolation circuit for use with a microelectronic die.

CROSS-REFERENCE TO RELATED APPLICATIONS

The present application is related to U.S. patent application Ser. No. 10/176,330, filed Jun. 20, 2002 and is assigned to the assignee as the present application and is incorporated herein in its entirety by reference.

BACKGROUND OF THE INVENTION

In semiconductor wafers including microelectronic dies formed on the wafers and the like, an electrical signal can be transmitted or shared from one component part or die to another. This can be the case in testing a wafer when a test signal can be sent to multiple different dies. One problem with sharing an electrical signal from one part or die to another is that a malfunction or defect in any of the dies can adversely effect the electrical signal being shared and cause the remaining dies to malfunction or appear to fail the test when the dies may actually be good.

One example where electrical signals are shared by a plurality of different parts or dies is in a parallel test system for Wafer Level Testing (WLT). In WLT, multiple dies on a wafer can be evaluated simultaneously. Prior to WLT, each of the dies on a wafer can be individually tested by probe testing or by a similar procedure to determine if any of the dies have certain defects. After probe testing, several predetermined electrical signals can be applied to contact pads formed on the wafer to more efficiently test multiple dies simultaneously. If one or more of the dies in a group being tested together are defective, the integrity of the shared electrical signal can be impacted such that potentially all of the dies sharing the signal can fail the test. There can also be uses other than testing when electrical signals are shared and one or more defective parts or dies can adversely effect the electrical signals and consequently the performance of a device or system incorporating the dies.

Electrical signals such as the shared electrical signals can be applied to a die by a conductive pad formed on the die or wafer. For example, at least one test pad can be formed in association with each die for applying test signals during WLT. The different test pads that share the test signal can be interconnected by conductive lines or traces. During normal operation of the die, a test pad and associated interconnect lines or traces can become inadvertently coupled to an associated die or remnants of a test pad and associated interconnect lines after the dies are separated from the wafer can become inadvertently coupled to the die. The test pad and interconnecting lines can present a substantial capacitive and resistive load coupled to the die that can adversely effect performance of the die.

Accordingly, for the reasons stated above, and for other reasons that will become apparent upon reading and understanding the present specification, there is a need for a circuit or device to isolate a defective die to prevent a shared signal from being impacted by the defective die and thereby adversely effecting the operation or testing of other dies to which the shared signal is applied. Additionally, there is a need for a circuit or device to prevent a test pad or other type pad from being coupled to an associated microelectronic die during normal operation of the die or during operation of the die other than when the pad is needed to apply a test signal or another signal. Further, there is a need for a method of testing multiple dies on a wafer where a defective die cannot adversely effect the testing of other dies sharing a common signal.

SUMMARY OF THE INVENTION

The above mentioned problems with defective microelectronic dies are addressed by the present invention and will be understood by reading and studying the following specification. Isolation circuits, microelectronic dies, semiconductor wafers and systems are provided by the present invention that isolate a defective die and thereby prevent a shared signal from being impacted by the defective die and prevent the defective die from effecting the operation or testing of other dies to which the shared signal is applied. The present invention also provides a circuit or device to prevent a test pad or other pad from being coupled to an associated microelectronic die during normal operation of the die or during operation of the die other than when the pad is needed to apply a signal.

In accordance with an embodiment of the present invention, an isolation circuit includes a first pad adapted to receive a control signal and a second pad adapted to receive another signal, such as a test signal. A third pad is coupled to a microelectronic die and a device is adapted to transfer the other signal from the second pad to the third pad in response to the control signal.

In accordance with another embodiment of the present invention, an isolation circuit includes a first pad adapted to receive a control signal and a second pad adapted to receive another signal. A third pad is coupled to a microelectronic die. A first device is adapted to transfer the other signal from the second pad to the third pad in response to the control signal. A second device is adapted to selectively prevent the second pad from being coupled to the third pad during a predetermined use or normal use of the microelectronic die.

In accordance with another embodiment of the present invention, an electronic system includes a processor and a memory system coupled to the processor, wherein at least one of the processor and the memory system are formed on a microelectronic die including an isolation circuit. The isolation circuit includes a first pad adapted to receive a control signal and a second pad adapted to receive another signal. A third pad is coupled to one of the processor or the memory system and a device is adapted to transfer the other signal from the second pad to the third pad in response to the control signal.

In accordance with another embodiment of the present invention, a method comprises: determining if any microelectronic dies of a plurality of microelectronic dies formed on a semiconductor wafer are defective; applying a test signal to a test pad associated with each of the microelectronic dies; operating a device associated with each microelectronic die to couple the test pad to a part pad if the microelectronic die is good, wherein the part pad is connected to the microelectronic die; and preventing the test signal from being applied to the microelectronic die if the die is defective.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments can be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process operations may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS) technology. A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

Figure 1:
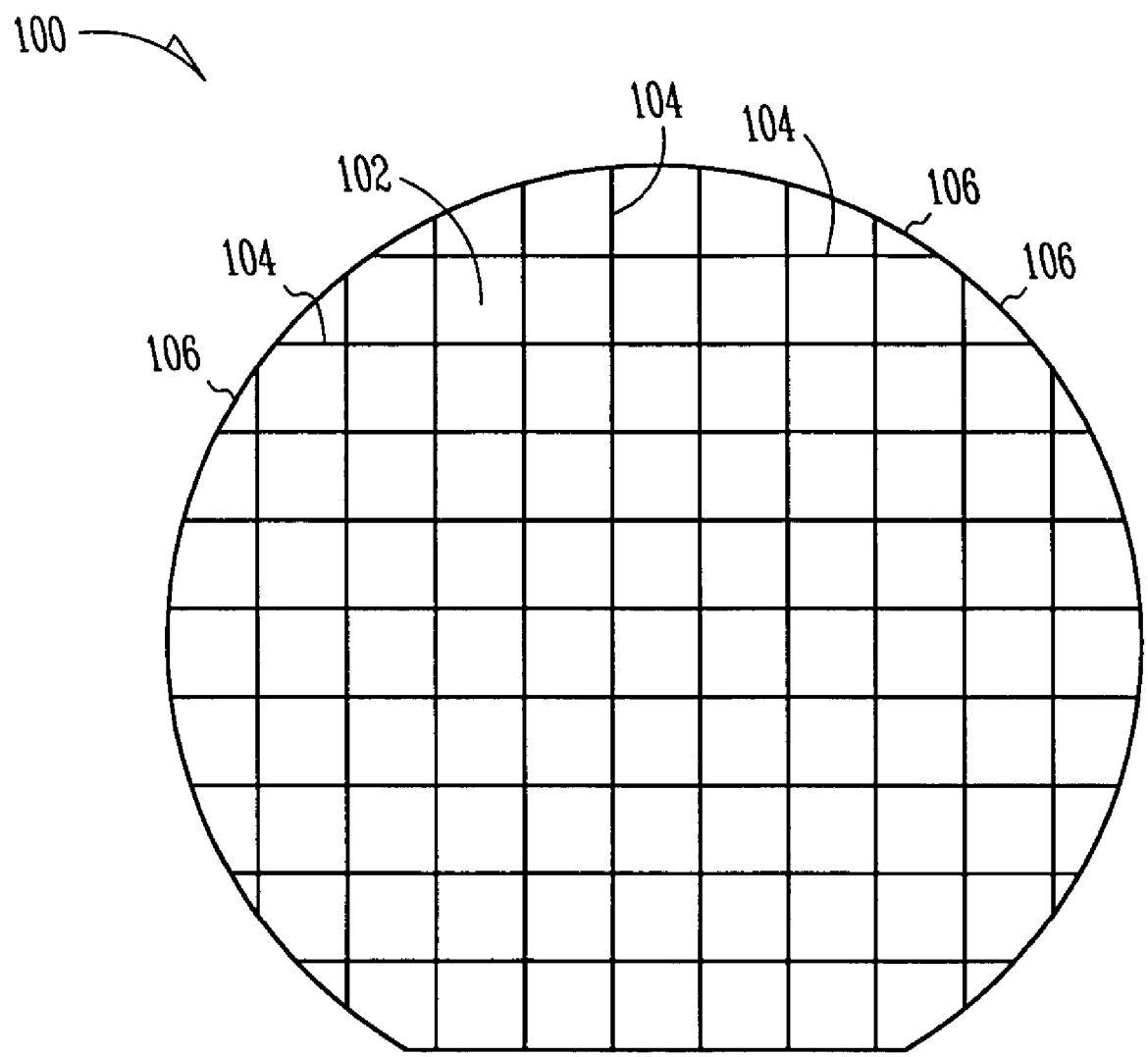
FIG. 1 is a top view of a wafer or substrate containing microelectronic or semiconductor dies in accordance with an embodiment of the present invention.

FIG. 1 is a top view of a wafer 100 or substrate containing a plurality of microelectronic or semiconductor dies 102 in accordance with an embodiment of the present invention. A die 102 is an individual pattern, typically rectangular, on a substrate that contains circuitry to perform a specific function. A semiconductor wafer 100 will typically contain a repeated pattern of such dies 102 containing the same functionality. Die 102 can further contain additional circuitry to extend to such complex devices as a monolithic processor with multiple functionality. Die 102 is typically packaged in a protective casing (not shown) with leads extending therefrom (not shown) providing access to the circuitry of the die 102 for unilateral or bilateral communication and control. The dies 102 are separated from one another by a scribe line 104. The scribe lines 104 can be used to separate each of dies 102 by sawing along the scribe lines 104. Near the edge of the wafer 100 are partial or incomplete dies that can be referred to as mutant dies 106. The mutant dies have typically have insufficient area to contain the repeated circuitry formed on the complete dies 102.

Figure 2:
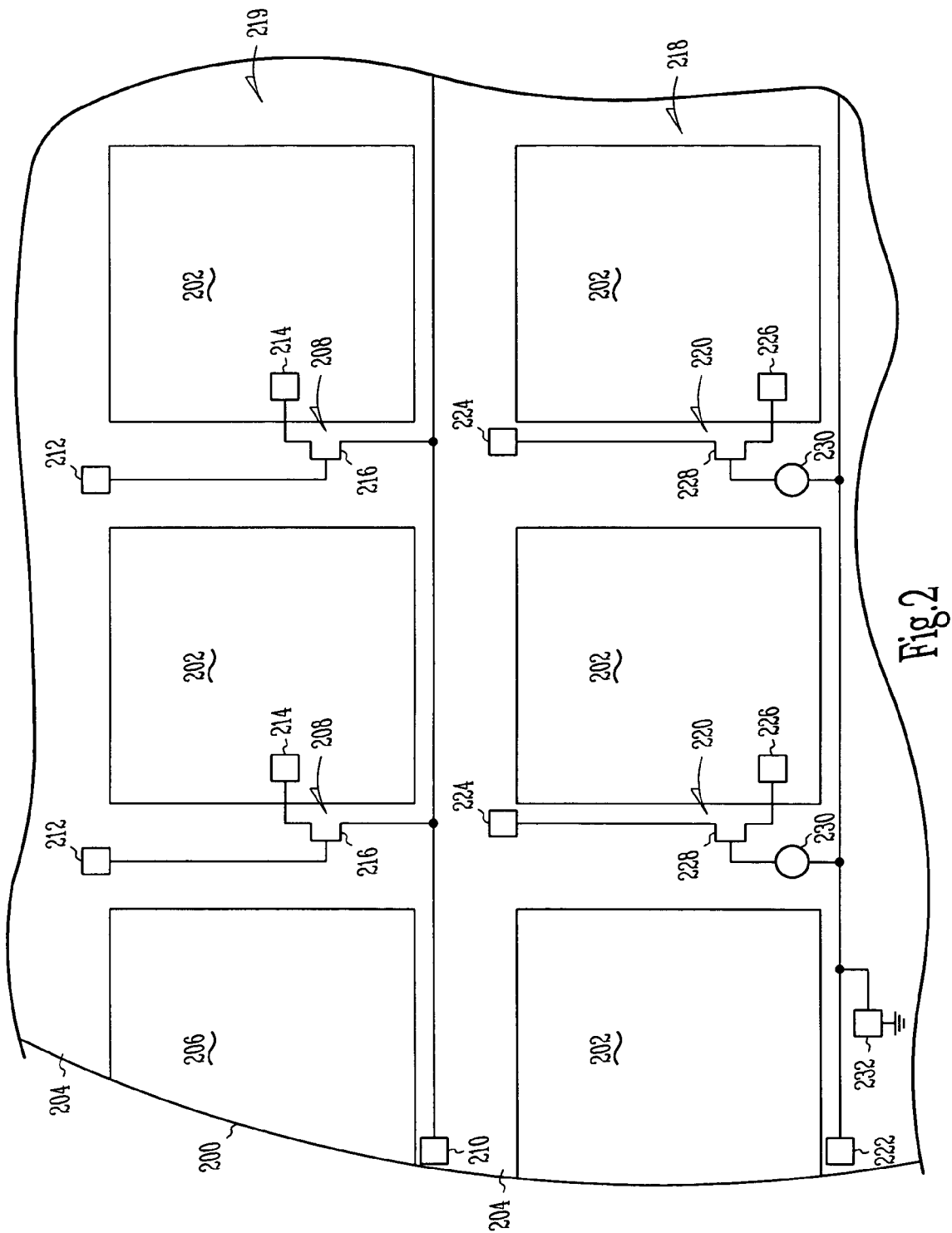
FIG. 2 is a top view of a portion of a wafer or substrate illustrating an isolation circuit in accordance with an embodiment of the present invention.

FIG. 2 is a top view of a portion of a wafer 200 or substrate illustrating an isolation circuit 208 in accordance with an embodiment of the present invention. The wafer 200 includes a plurality of complete microelectronic dies 202 and mutant dies 206. The dies 202 and 206 are separated by scribe lines 204. The wafer 200 also includes isolation circuits 208. Each isolation circuit 208 can be coupled to a first conductive pad 210 adapted to receive a test signal or other signal or power from a probe of a test system (not shown in FIG. 2) or the like. A second conductive pad 212 of each the isolation circuit 208 can be adapted to receive a control signal from another probe of the test system, and a third conductive pad 214 can be coupled to an associated microelectronic die 202. A device 216 can be coupled between the first conductive pad 210 and each third conductive pad 214 to transfer any electrical signals or power at the first conductive pad 210 to the third conductive pad 214 in response to the device receiving a control signal from the second conductive pad 212. The device 216 can be an N-channel transistor as shown in FIG. 2 or the device 216 can also be a P-channel transistor, a multiplexor, a conductive jumper, an anti-fuse type device or other fuse type device or a combination of such devices that can be selectively formed or activated to couple the first pad 210 to the third pad 214 or selectively deactivated or open circuited to prevent the first pad 210 from being coupled to the third pad 214 in the event that the particular associated die 202 is defective.

In parallel testing multiple dies 202 on a wafer 200 or wafer level testing (WLT), the first conductive pad 210 can be coupled to a plurality of devices 216 as shown in FIG. 2. Prior to WLT or parallel testing, each of the dies 202 can be individually probe tested to determine if any of the dies 202 have certain defects that could adversely impact a signal shared with multiple dies and possibly cause good dies to appear to malfunction or otherwise fail testing. If a defective die 202 is found, the test system can apply a control signal (or not apply a control signal) to the second pad 212 to prevent the device 216 from operating and thus prevent the first conductive pad 210 from being coupled to the third conductive pad 214 and to the microelectronic die 202.

Another embodiment of the present invention is shown with respect to a second row 218 of dies 202 in FIG. 2. This other embodiment and the embodiment described above with respect to the first row 219 of dies would not necessarily be used in practice together on the same wafer 200 but typically one embodiment or the other can be used through out an entire wafer 200. In this embodiment, each isolation circuit 220 is coupled to a first conductive pad 222 adapted to receive a control signal from a probe of a test system (not shown) or the like. A second conductive pad 224 of each isolation circuit 220 can be adapted to receive a control signal form another probe of the test system, and a third conductive pad 226 can be coupled to an associated microelectronic die 202. A device 228 can be coupled between the second conductive pad 224 and the third conductive pad 226 of each isolation circuit 220 to transfer any electrical signals or power at the second conductive pad 224 to the third conductive pad 226 in response to the device 228 receiving a control signal from the first conductive pad 222.

The isolation circuit 208 can also include a second device 230 connected between the first conductive pad 222 and each of the devices 228 to control the connection or application of the control signal to each of the devices 228. The second device 230 can be an anti-fuse type device, a fuse type device, a conductive jumper or a MOS device or a combination thereof. Accordingly, the second devices 230 can be open circuits or closed circuits initially and can be selectively opened or closed to provide flexibility in controlling the application of the control signal to selected dies 202. For example, if a die 202 is determined to be defective during a probing operation of the wafer 200, then the second device 230 associated with the defective die 202 can be open circuited, if close circuited initially, or left open to prevent a control signal from operating the first device 228 associated with the defective die 202 and allowing the second pad 224 to be coupled to the third pad 226.

In a further embodiment of the present invention, a third device 232 can be coupled to the first pad 222 to control the application of a control signal to a group of devices 228 associated with the particular first pad 222. In this way application of a signal from the second pad 224 to an entire group of dies 202, such as a row or column of dies 202, can be controlled. The third device 232 can be a fuse type device, anti-fuse type device, MOS device or the like or a combination of such devices. For example, the third device 232 can be a MOS device to couple the gates of the N-channel transistors 228 to ground to inactivate the transistors 228 and prevent any signal at second pads 224 from passing to the third pads 226 and being applied to the dies 202 in a row or column of dies 202.

As shown in FIG. 2, the first conductive pad 222 (or 210), the second conductive pad 224 (or 212), the first device 228 (or 216), and the second and third devices 230 and 232, if provided, can be formed in the scribe 204. The third conductive pad 226 can generally be formed on the die 202.

Control signals can be applied to the first conductive pads 222 and test signals or other signals can be applied to the second conductive pads 224 by probes or pins of a parallel test system (not shown in the Figures) to simultaneously test a plurality of dies 202 on the wafer 200.

Figure 3:
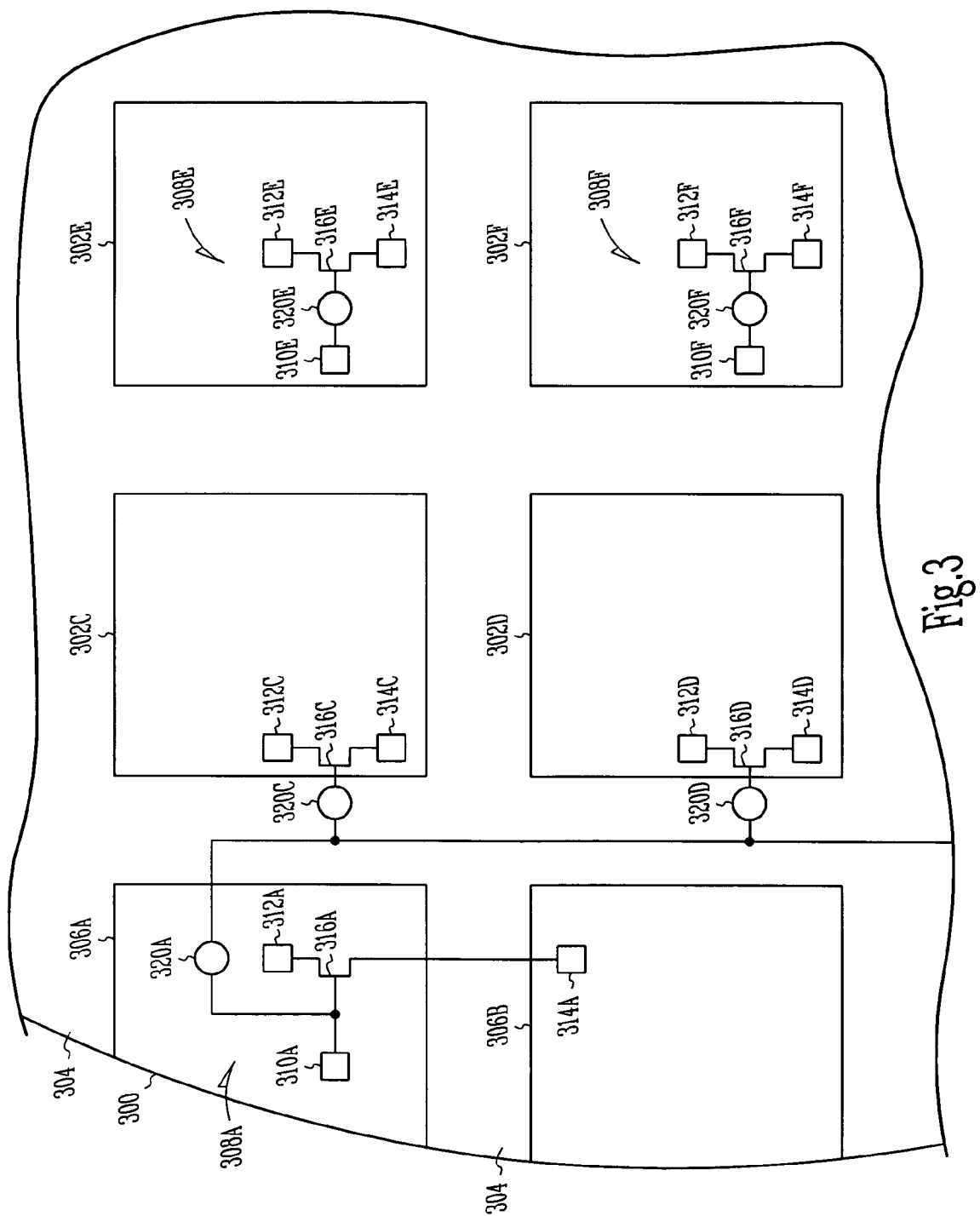
FIG. 3 is a top view of a portion of a wafer or substrate illustrating an isolation circuit in accordance with another embodiment of the present invention.

FIG. 3 is a top view of a portion of a wafer 300 or substrate illustrating isolation circuits 308 in accordance with another embodiment of the present invention. In this embodiment, an isolation circuit 308A can be at least partially formed on a mutant die 306A. A first conductive pad 310A, a second conductive pad 312A and a device 316A can be formed on the mutant die 306A. The device 316A can be coupled to a third pad 314A coupled to a mutant die 306B. The first pad 310A can be coupled to other devices 316C and 316D formed on dies 302C and 302D respectively. A second conductive pad 312C coupled to the device 316C can also be formed on the die 302C and a second pad 312D coupled to the device 316D can be formed on the die 302D. Accordingly, portions of an isolation circuit 308 can be formed on a mutant die 306 or on the die 302 itself. A good or complete die 302 can also be used or sacrificed, a sacrifice die, to form all or portions of an isolation circuit 308. A complete isolation circuit 308E and 308F are formed on the dies 302E and 302F respectively. The isolation circuits 308E and 308F can also be coupled to other dies 302 (not shown in FIG. 3) to isolate or prevent a signal applied to a second conductive pad 312 associated with one of these other dies 302 from being applied to a third conductive pad 314 that is coupled to a component or circuit formed on one of these other dies 302.

Figure 4:
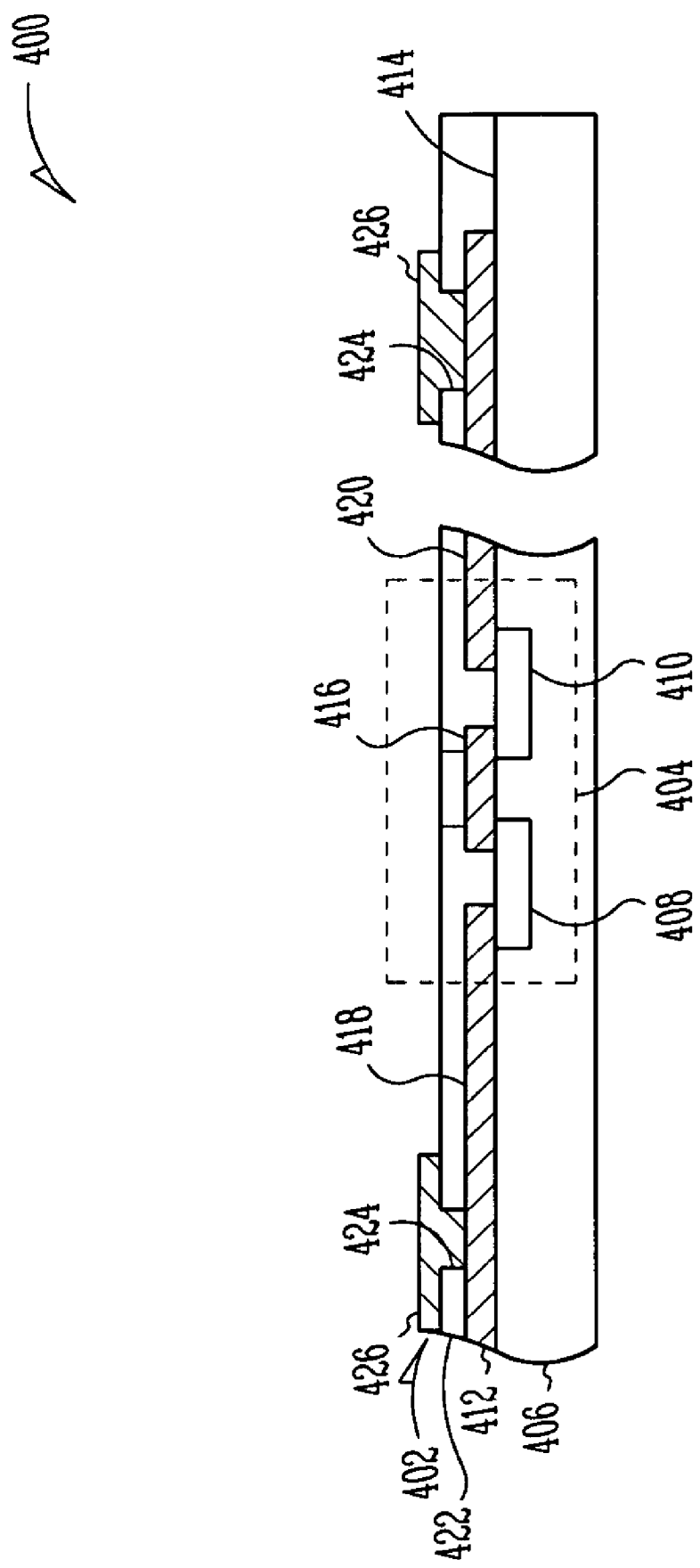
FIG. 4 is a cross-sectional view of a wafer or substrate showing a redistribution layer (RDL) in accordance with an embodiment of the present invention.

FIG. 4 is a cross-sectional view of a portion of a semiconductor wafer 400 showing a redistribution layer (RDL) 402 in accordance with an embodiment of the present invention. The RDL 402 can be any type of conductive material. The conductive pads 210, 212, 214 and the interconnecting conductive lines or traces in FIG. 2 and the conductive pads 310, 312 and 314 and the interconnecting conductive lines or traces in FIG. 3 can be formed in a RDL, such as the RDL 402 (FIG. 4) to make contact with devices or components, such as device 404 formed on a substrate 406 of the semiconductor wafer 400. As an example in FIG. 4, the device or component 404 can be a MOS device including a first source/drain region 408 and a second source/drain region 410 formed in the substrate 406. A first layer 412 of conductive material or metallization can be formed on a surface 414 of the substrate 406 and selectively patterned to form a gate electrode 416, a first source/drain electrode 418 in contact with the first source/drain region 408 and a second source/drain electrode 420 in contact with the second source/drain region 410. A layer 422 of insulation material can be formed over the first layer 412 of conductive material. The RDL can be formed by forming vias 424 in the layer 422 of insulation material at selected locations to make contact with the underlying devices or components 404. Conductive pads 426 can then be formed at each of the vias 424. The conductive pads 426 are similar to the conductive pads 210, 212 and 214 of FIG. 2 and the conductive pads 310, 312 and 314 of FIG. 3 and provide probe points or locations where electrical signals can be applied or measured during testing operations or for other purposes.

Figure 5:
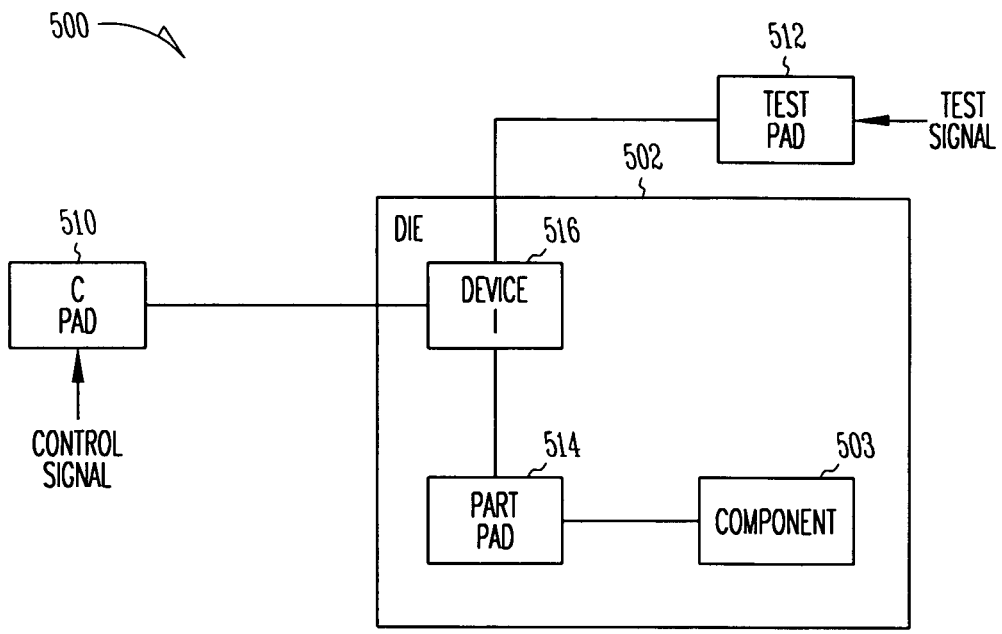
FIG. 5 is a block schematic diagram of an isolation circuit in accordance with an embodiment of the present invention.

FIG. 5 is a block schematic diagram of an isolation circuit 500 in accordance with an embodiment of the present invention. The isolation circuit 500 includes a first pad or a control pad 510 adapted to receive a control signal and a second pad 512 adapted to receive a test signal, power or another type signal. A third pad or part pad 514 can be coupled to a microelectronic die 502 or to a component part 503 formed on the microelectronic die 502. A first device 516 couples the test pad 512 to the part pad 514 to transfer the test signal or power to the die 502 or to the component 503 formed on the die 502 in response to the control signal from the control pad 510. The first device 516 can be an N-channel MOS device, a P-channel MOS device, a multiplexor, a conductive or metal jumper, a fuse device, such as a fusible link, laser fuse or the like, or an anti-fuse device or a combination of such devices. As previously discussed with respect to FIGS. 2 and 3, any or all of the pads 510, 512 and the device 516 can be formed in a scribe 104 (FIG. 1), on the die 502 itself, on a mutant die 106 (FIG. 1) or on a sacrifice die 102 (FIG. 1).

Figure 6:
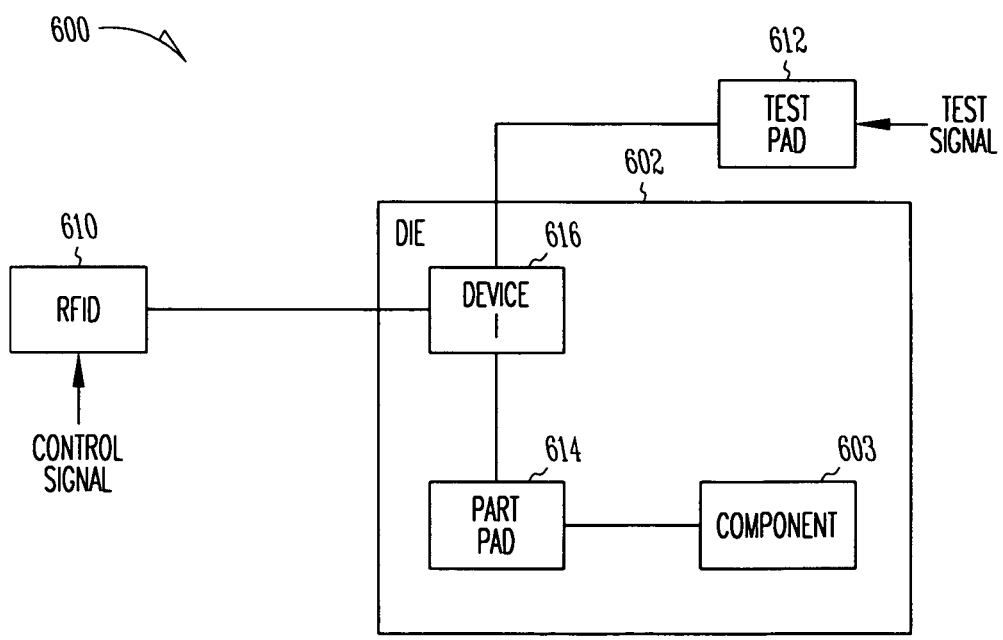
FIG. 6 is a block schematic diagram of an isolation circuit in accordance with another embodiment the present invention.

FIG. 6 is a block schematic diagram of an isolation circuit 600 in accordance with another embodiment of the present invention. The isolation circuit 600 includes a test pad 612, a part pad 614 connected to a microelectronic die 602 or to a component part 603 formed on the die 602 and a first device 616 to couple the test pad 612 to the part pad 614 in response to receiving a control signal. The isolation circuit 600 can also include a radio frequency identification circuit (RFID) 618 or wireless identification circuit, such as a Bluetooth® type device or the like, coupled to the first device 616 to control operation of the first device 616. The RFID 618 receives a predetermined wireless or RF signal or a coded RF signal and generates a control signal to control operation of the first device 616 in response to the predetermined RF signal. Accordingly, different isolation circuits 600 on a wafer, such as wafer 100 in FIG. 1, can be selectively controlled to operate (or not operate) the associated device 616 by a wireless signal without having to physically contact the isolation circuit 602. This process can be useful when the die 600 or wafer is not accessible.

Figure 7:
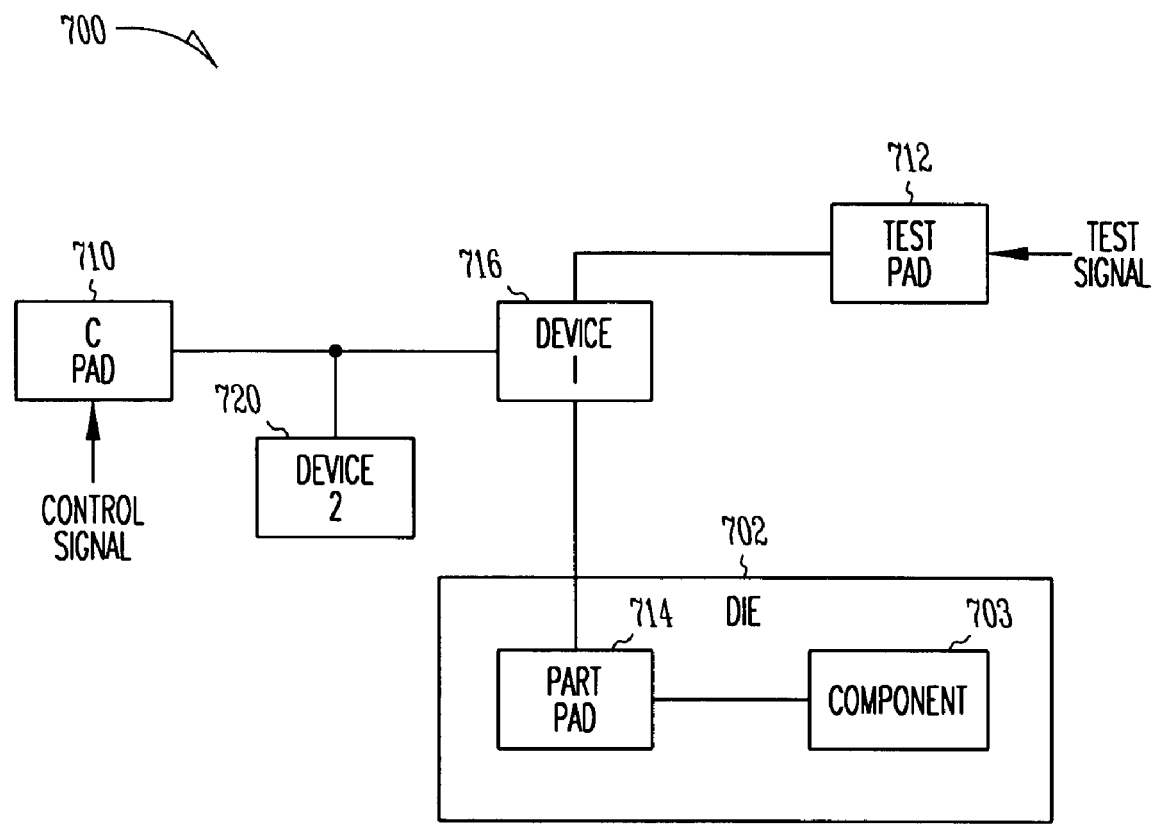
FIG. 7 is a block schematic diagram of an isolation circuit in accordance with a further embodiment of the present invention.

FIG. 7 is a block schematic diagram of an isolation circuit 700 in accordance with a further embodiment of the present invention. The isolation circuit 700 includes a second device 720 adapted to selectively prevent the first device 716 from operating to prevent the second pad 712 from inadvertently being coupled to the part pad 714 during a predetermined use of the microelectronic die 702, such as a normally intended use of the die 702. The second device 720 can be any device or circuit that can be used to prevent the first device 716 from operating and allowing the test pad 712 to be coupled to the part pad 714 during a predetermined use of the die 702. The test pad 712 can present a significant resistive and capacitive load when coupled to the die 702 during operation of the die 702 other than testing. Accordingly, the test pad 712 should be prevented from coupling to the part pad 714 during such operations.

Figure 8:
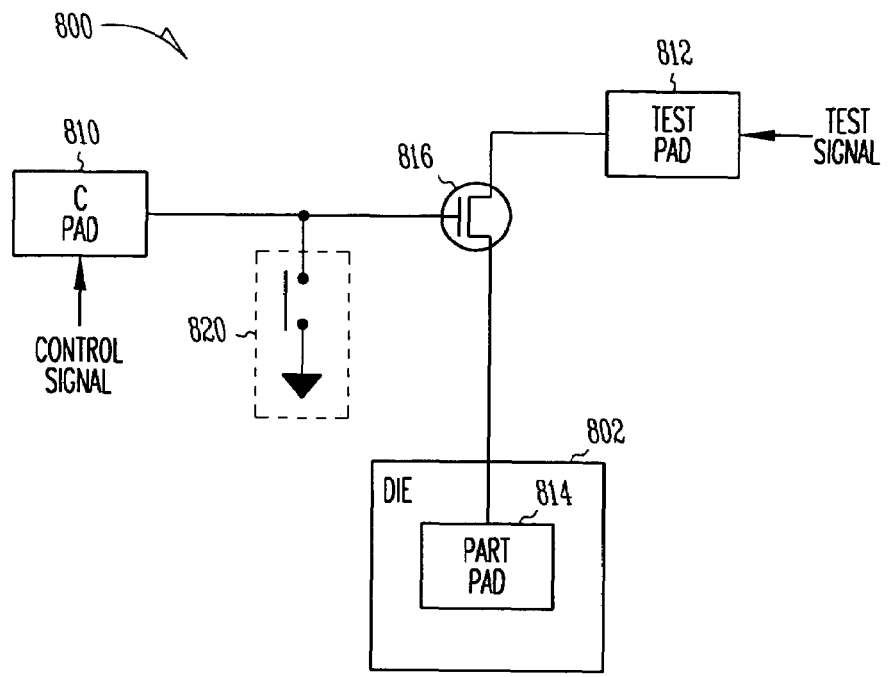
FIG. 8 is a block schematic diagram of an isolation circuit including a conductive jumper to selectively prevent a test pad from being coupled to a part pad in accordance with another embodiment of the present invention.

FIG. 8 is a block schematic diagram of an isolation circuit 800 including a conductive jumper 820, as an example of the second device 720 in FIG. 7, to selectively prevent a test pad 812 from being coupled to a part pad 814 in accordance with an embodiment of the present invention. The isolation circuit 800 includes an N-channel transistor 816, as a example of the first device 716 in FIG. 7, to couple the test pad 812 to the part pad 814 in response to a control signal from the control pad 810. After testing or before normal operation of the die 802, a conductive jumper 820 can be formed to connect the gate of the N-channel transistor 816 to ground potential to prevent the transistor 816 from operating and coupling the test pad 812 to the part pad 814 and thereby adversely effecting operation of the die 802.

Figure 9:
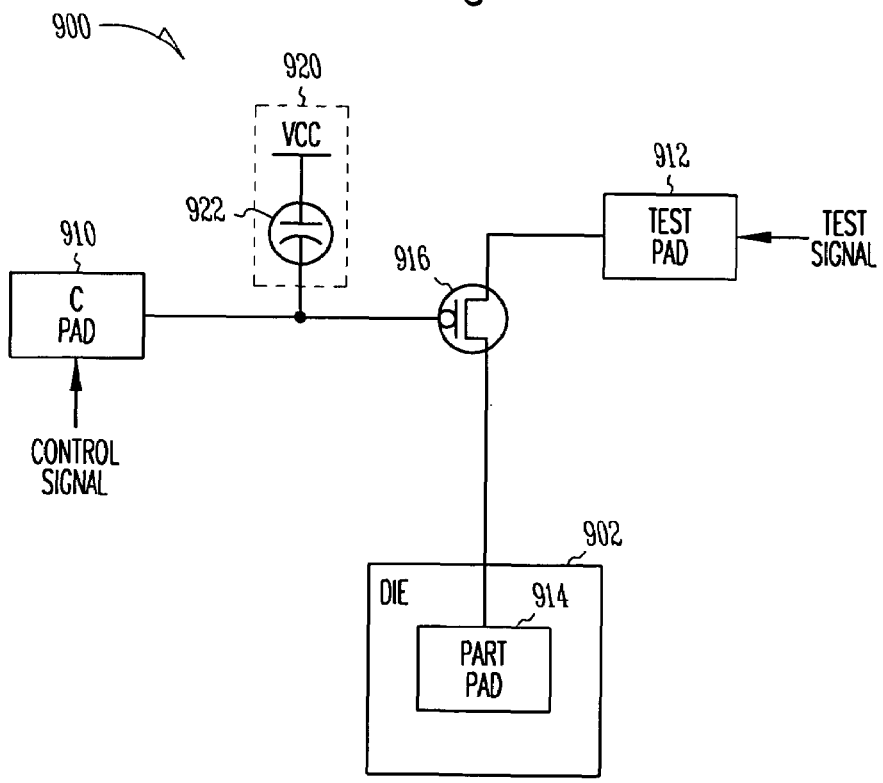
FIG. 9 is a block schematic diagram of an isolation circuit including an anti-fuse to selectively prevent a test pad from being coupled to a part pad in accordance with an embodiment of the present invention.

FIG. 9 is a block schematic diagram of an isolation circuit 900 including a circuit 920 with an anti-fuse type device 922 coupled to a supply voltage VCC, as an example of the second device 720 in FIG. 7, to selectively prevent a test pad 912 from being coupled to a part pad 914 in accordance with an embodiment of the present invention. The isolation circuit 900 includes a P-channel transistor 916, as an example of the first device 716 in FIG. 7, to couple the test pad 912 to the part pad 914 in response to a control signal from the control pad 910. After the die 902 is tested or before normal operation of the die 902, the anti-fuse type device 922 can be operated to couple a gate of the P-channel transistor 916 to the supply voltage VCC to prevent the P-channel transistor 916 from operating and coupling the test pad 912 to the part pad 914 and to the die 902 whenever the die 902 is operating under normal conditions.

Figure 10:
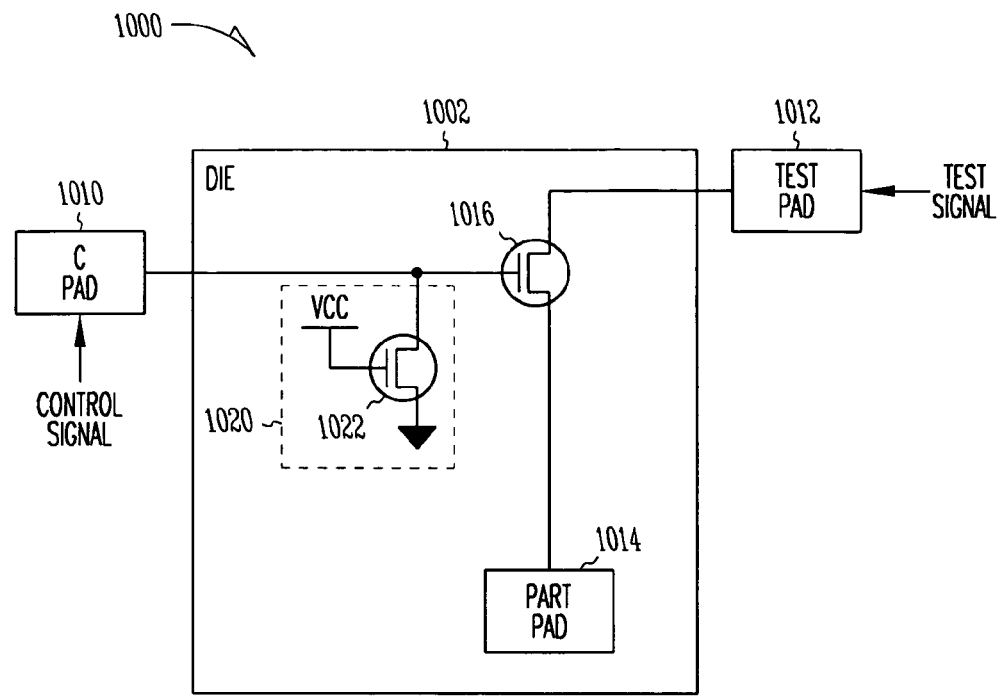
FIG. 10 is a block schematic diagram of an isolation circuit in accordance with another embodiment of the present invention.

FIG. 10 is a block schematic diagram of an isolation circuit 1000 in accordance with another embodiment of the present invention. The isolation circuit 1000 includes a control pad 1010 adapted to receive a control signal and a test pad 1012 adapted to receive a test signal. A part pad 1014 can be coupled to a microelectronic die 1002 and an N-channel transistor 1016, as an example of the first device 716 in FIG. 7, can be provided to couple the test pad 1012 to the part pad 1014 in response to a control signal from the control pad 1010. The isolation circuit 1000 further includes a circuit 1020, as an example of the second device 720 in FIG. 7, to couple a gate of the N-channel transistor 1016 to ground potential or any potential to prevent the transistor 1016 from operating and coupling the test pad 1012 to the part pad 1014 during normal operations of the die 1002. The circuit 1020 can include a second N-channel transistor 1022 with a gate that can be coupled to a supply voltage VCC whenever the die 1002 is in normal operation. The supply voltage VCC causes the transistor 1022 to operate and connect the gate of the transistor 1016 to ground potential to prevent the transistor 1016 from operating and connecting the test pad 1012 to the part pad 1014 during normal operation of the die 1002. The transistor 1022 can typically be a weak drive transistor so that a tester drive signal applied to the control pad 1010 can overdrive the transistor 1022.

While the embodiment shown in FIG. 10 uses N-channel transistors for transistors 1016 and 1022, P-channel transistors could be used as well with the appropriate voltages or signals being applied to the transistors to prevent the test pad 1012 from being coupled to the part pad 1014 if the die 1002 is defective or during normal operation of the die 1002.

Figure 11:
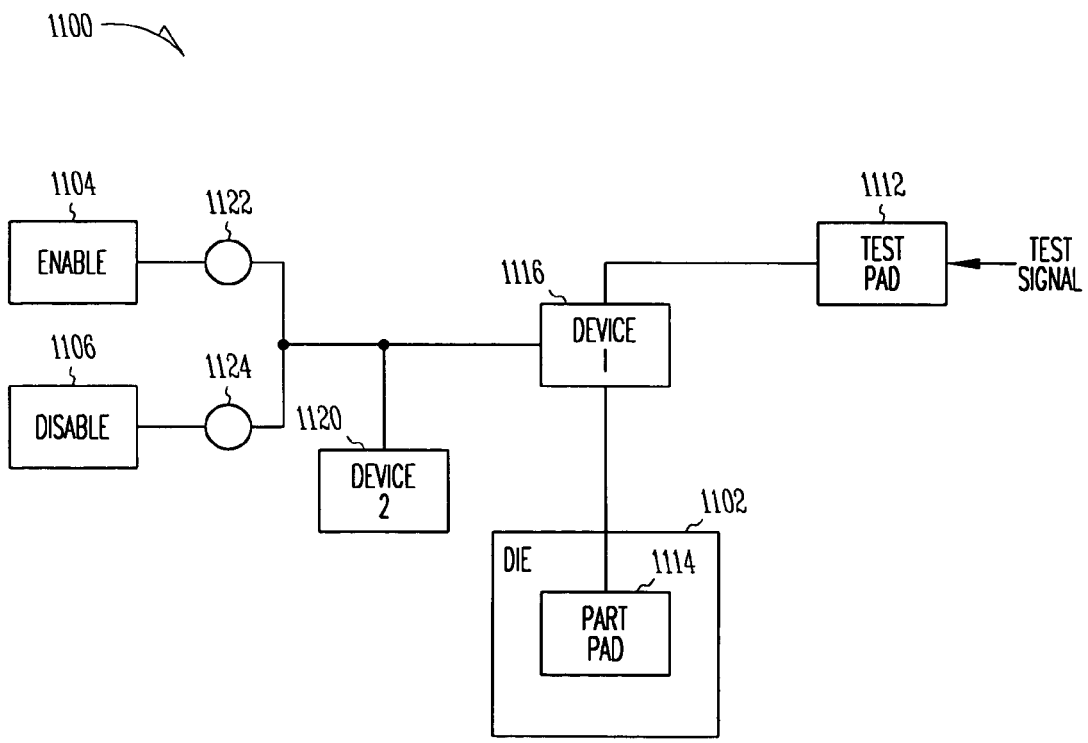
FIG. 11 is a block schematic diagram of an isolation circuit in accordance with a further embodiment of the present invention.

FIG. 11 is a block diagram of an isolation circuit 1100 including an enable pad 1104 and a disable signal pad 1106 in accordance with an embodiment of the present invention. The enable pad 1104 and the disable pad 1106 are each coupled to a first device 1116 to control operation of the device 1116. The isolation circuit 1100 includes a test pad 1112 adapted to receive a test signal and a part pad 1114 coupled to a microelectronic die 1102. The test pad 1112 is coupled to the part pad 1114 by the first device 1116 in response to an enable signal from the enable pad 1104 and the first device 1116 is non-operational or disabled in response to a disable signal from the disable pad 1106. The enable pad 1104 can be connected to or disconnected from the first device 1116 by a component 1122 such as a fuse device or an anti-fuse device to provide flexibility in connecting or disconnecting the enable pad 1104 to the first device 1116. Similarly, the disable pad 1106 can be connected to or disconnected from the first device 1116 by a component 1124 such as a fuse device or an anti-fuse device.

The isolation circuit 1100 can also include a second device 1120 to prevent the test pad 1112 from being coupled to the part pad 1114 during normal operation of the die 1102. As previously discussed, the first device 1116 and the second device 1120 can each be a MOS device, a multiplexor, a conductive or metal jumper, a fuse type device or an anti-fuse type device or a combination of such devices. The first device 1116 and the second device 1120 can both be formed on the die 1102.

Figure 12:
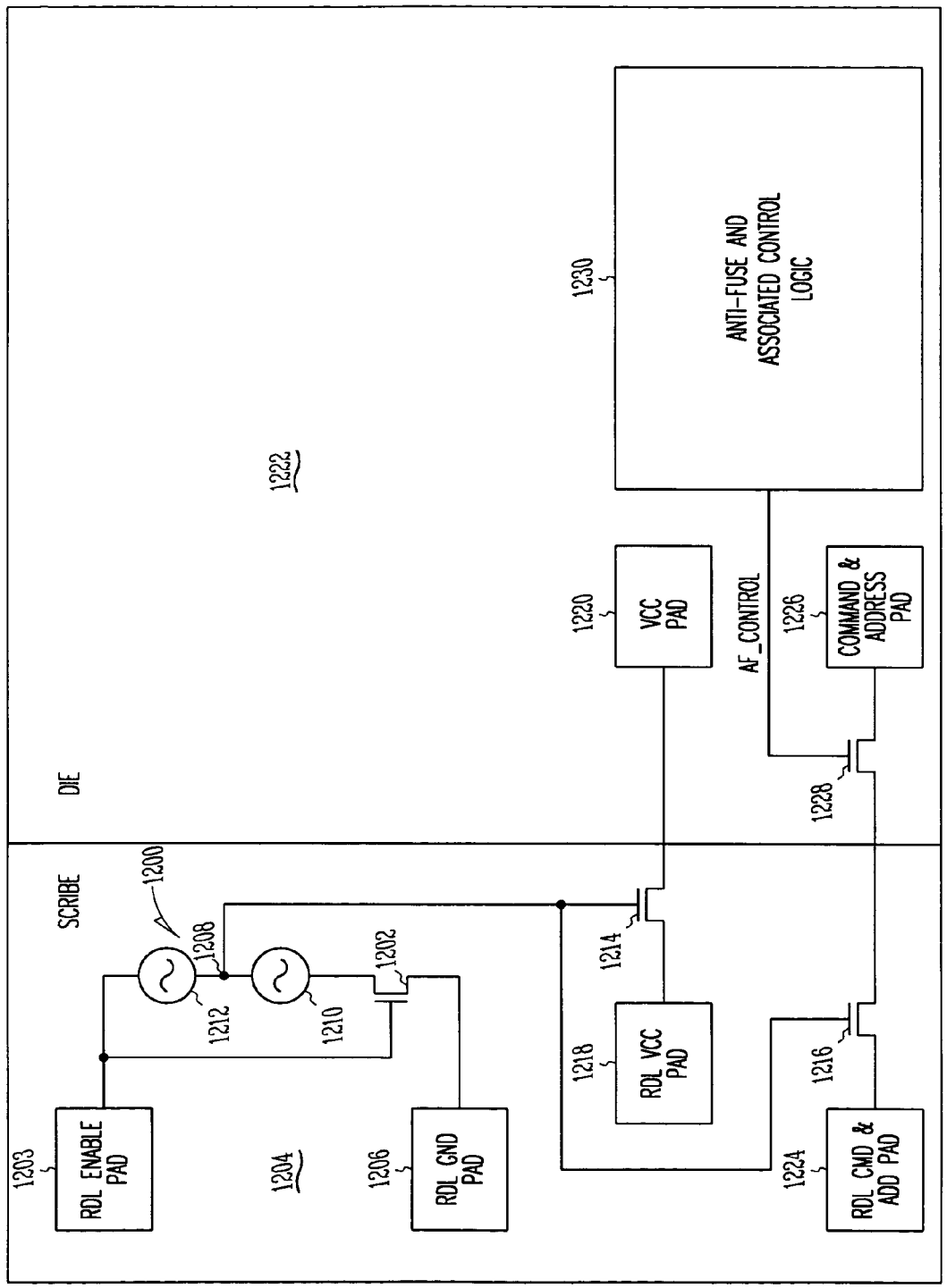
FIG. 12 is an example of an application of an isolation circuit in accordance with an embodiment of the present invention.

FIG. 12 is an example of an application of an isolation circuit 1200 in accordance with an embodiment of the present invention. The isolation circuit 1200 includes a first MOS transistor 1202. In the example shown, the first MOS transistor 1202 can be an N-channel transistor although a P-channel transistor could be used as well with the appropriate signals being applied to the gate for operation and non-operation of the transistor 1202. A gate of the transistor 1202 can be coupled to a RDL enable pad 1203 that can be formed in a redistribution layer (RDL) or upper most conductive layer similar to the RDL 402 shown in FIG. 4. One source/drain terminal of the transistor 1202 can be coupled to a RDL ground pad 1206 and the other source/drain terminal of the transistor 1202 can be connected to a node 1208 through a fuse device 1210. The fuse device 1210 can be formed from metal, polysilicon or other fusible conductive material. The RDL enable pad 1203 can also be connected to the node 1208 through a fuse device 1212. The node 1208 can be connected to a second MOS device 1214 and to a third MOS device 1216. In the example of FIG. 12, the MOS devices 1214 and 1216 are N-channel transistors but could also be P-channel devices. One source/drain terminal of the MOS device 1214 can be connected to a RDL VCC pad 1218 to receive a supply voltage and the other source/drain terminal of the MOS device 1214 can be connected to a VCC pad 1220 on the die 1222. The MOS device 1214 can connect a supply voltage or a power source to the VCC pad 1220 on the die 1222 when the MOS device 1214 is activated or turned on by a control signal applied to the RDL enable pad 1203. The RDL VCC pad 1218 can be formed in an RDL in a scribe line 1204 and the VCC pad 1220 can be formed on the die 1222 and in contact therewith. One source/drain terminal of the MOS device 1216 can be connected to a RDL command and address pad (RDL CMD & ADD) 1224 and the other source/drain of the MOS device 1216 can be connected to command and address pad 1226 formed on the die 1222.

Another MOS device 1228 can be coupled between the MOS device 1216 and the command and address pad 1226 formed on the die 1222. The MOS device 1228 can be an N-channel transistor with a gate electrode connected to an anti-fuse and associated control logic circuitry 1230 to control operation of the MOS device 1228. Anti-fuses and associated control logic circuitry to control operation or blowing of the anti-fuse, such as anti-fuse and associate control logic 1230, are known. The anti-fuse and associated control logic 1230 can provide an AF_CONTROL signal to control operation of the N-channel MOS device 1228. The AF_CONTROL signal can be translated by the anti-fuse and associated control logic circuitry 1230 to a higher or lower voltage other than a supply voltage VCC to optimize the turning on of the MOS device 1228. The N-channel MOS device 1228 will be on or operative in response to the AF_CONTROL signal being high or a logic "1"when the anti-fuse of the anti-fuse and control logic circuitry 1230 is not blown or operated. In this on or operative state, the MOS device 1228 can pass any signals from the MOS device 1216 to the command and address pad 1226. The MOS device 1228 will be off or non-operative in response to the AF_CONTROL signal being low or a logic "0"when the anti-fuse of the anti-fuse and control logic 1230 is blown. In this off or non-operative state, the MOS device 1228 isolates the command and address pad 1226 from the capacitance associated with the conductive routing trace between the MOS device 1228 and the MOS device 1216. Those skilled in the art will recognize that P-channel MOS devices could be substituted for N-channel devices with the gate control voltages being reversed or the opposite polarity to control operation of the P-channel MOS devices.

If the die 1222 is found to be good during a probe operation to evaluate the individual die 1222 prior to parallel testing, WLT or wafer level burn-in (WLB), the isolation circuit 1200 is operated by blowing the fuse device 1210 and leaving the fuse device 1212 intact. An enable signal applied to the RDL enable pad 1203 will turn on or activate the MOS devices 1214 and 1216. The MOS device 1214 will transfer any test signal, power or other signal applied to the RDL VCC pad 1218 to the VCC pad 1220 on the die 1222, and the MOS device 1216 will transfer any test signal or other signal applied to the RDL command and address pad 1224 to the command and address pad 1226 on the die 1222.

If the die 1222 is found to be defective during a probe operation to evaluate the individual die 1222 prior to parallel testing or WLT or WLB, the isolation circuit 1200 is operated by blowing the fuse device 1212 and leaving the fuse device 1210 intact. A high signal or an enable signal applied to the RDL enable pad 1203 by a probe of a parallel test system causes the MOS device or transistor 1202 to operate and to connect the RDL ground pad 1206 and ground potential to the MOS devices 1214 and 1216 to prevent them from operating. Accordingly, the RDL VCC pad 1218 is not coupled to the VCC pad 1220 on the die 1222 and the RDL CMD & ADD pad 1224 are not coupled to the Command & Address pad 1226 on the die 1222. Therefore, if the die 1222 is defective, the die 1222 can effectively be isolated during WLB, WLT or parallel testing so as to not adversely effect the testing of other dies on a wafer.

Figure 13:
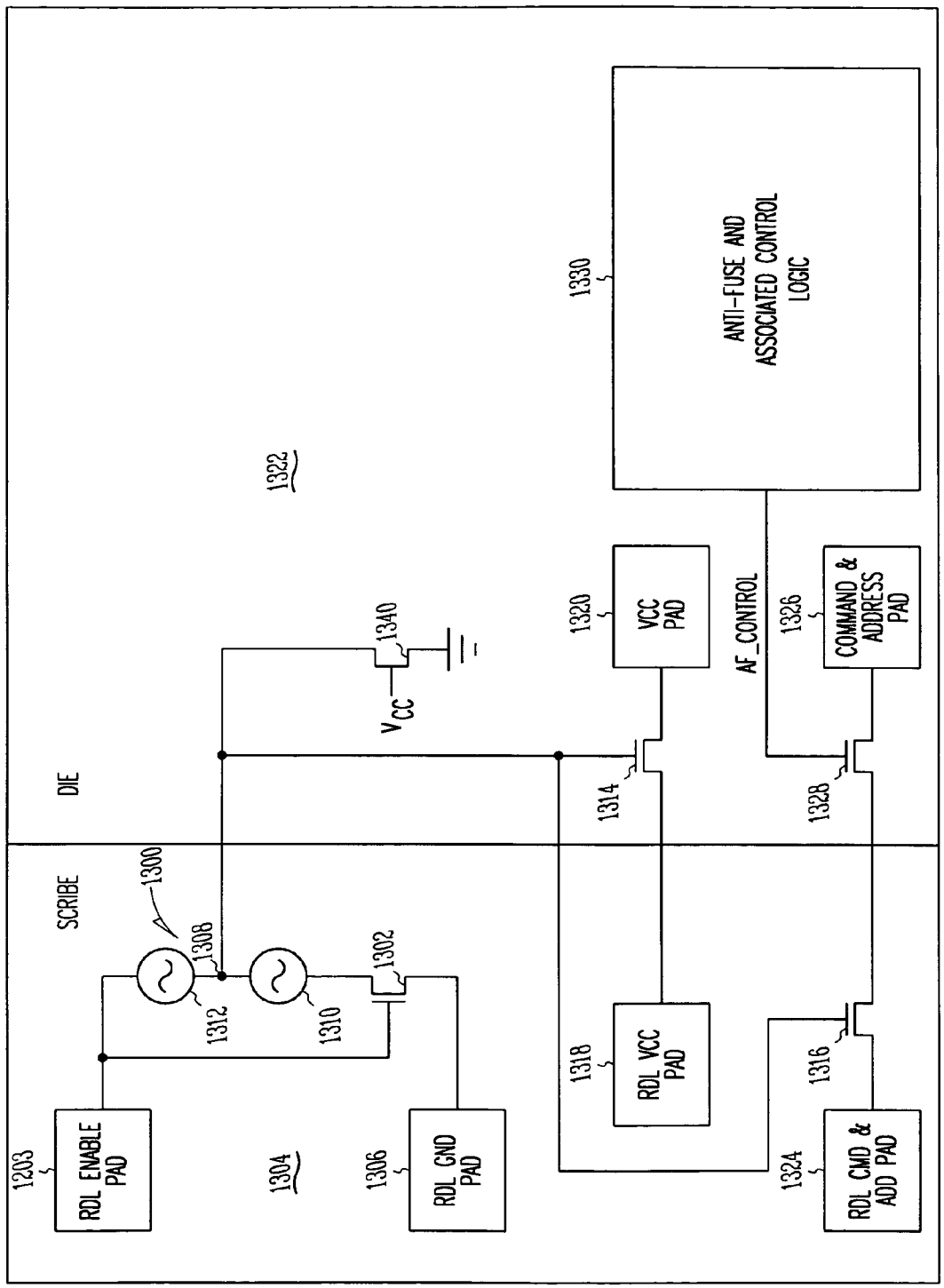
FIG. 13 is another example of an application of an isolation circuit in accordance with an embodiment of the present invention.

FIG. 13 is another example of an application of an isolation circuit 1300 in accordance with an embodiment of the present invention. The isolation circuit 1300 is similar to the isolation circuit 1200 in FIG. 12 except the second MOS device 1314 coupled between a RDL VCC pad 1318 and a VCC pad 1320 can be formed on the die 1322 rather than in the scribe 1304 as shown in FIG. 12. The third MOS device 1316 can also be formed on the die 1322. If either the second MOS device 1314 or the third MOS device 1316 are formed on the die 1322, another MOS device 1340 can be formed on the die 1322 and coupled to the node 1308. In the example shown in FIG. 13, the MOS device 1340 can be an N-channel transistor or the like. The gate of the N-channel transistor 1340 can be connected to VCC to connect the gates of the second MOS device 1314 and the third MOS device 1316 to ground potential to turn off the second MOS device 1314 and the third MOS device 1316 during a selected operation of the die 1322, such as normal operation of the die 1322, and with the RDL removed or sawed off. Turning off the second MOS device 1314 prevents the RDL VCC pad 1318 from being coupled to the VCC pad 1320 during normal operation of the die 1322 and turning off the third MOS device 1316 prevents the RDL CMD & ADD pad 1324 from being coupled to the Command & Address pad 1326 during normal operation or a predetermined operation of the die 1322.

Another MOS device 1328 similar to the MOS device 1228 in FIG. 12 can be coupled between the third MOS device 1316 and the command and address pad 1326. The gate electrode of the MOS device 1328 can be coupled to an anti-fuse and associated control logic circuitry 1330 to control operation of the MOS device 1328. The anti-fuse and associated control logic circuitry 1330 can be similar to the anti-fuse and associated control logic 1230 in FIG. 12 and can operate in a like manner.

Figure 14:
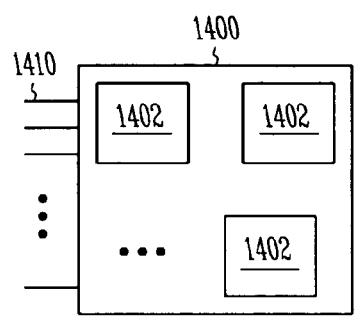
FIG. 14 is a block schematic diagram of a circuit module including microelectronic dies having isolation circuits in accordance with an embodiment of the present invention.

FIG. 14 is a block schematic diagram of a circuit module 1400 including microelectronic dies 1402 with isolation circuits, similar to those previously described in FIGS. 2-13, in accordance with an embodiment of the present invention. As shown in FIG. 14, two or more dies 1402 can be combined, with or without a protective casing, into a circuit module 1400 to enhance or extend the functionality of an individual die 1402. Circuit module 1400 can be a combination of dies 1402 representing a variety of functions, or a combination of dies 1402 containing the same functionality. Some examples of a circuit module 1400 include memory modules, device drivers, power modules, communication modems, processor modules and application-specific modules and can include multi-layer, multi-chip modules. Circuit module 1400 can be a sub-component of a variety of electronic systems, such as a clock, a television, a cell phone, a personal computer, an automobile, an industrial control system, an aircraft and others. Circuit module 1400 will have a variety of leads 1410 extending therefrom providing unilateral or bilateral communication and control.

Figure 15:
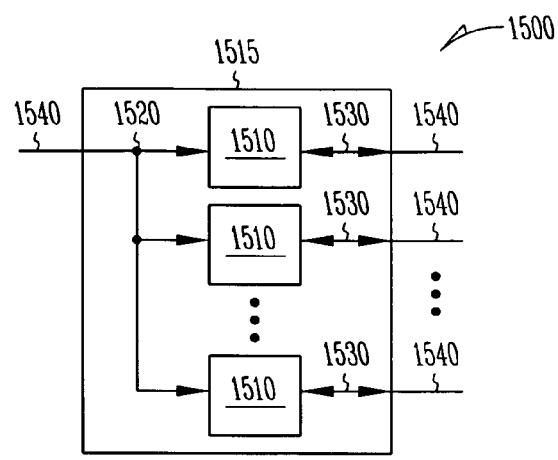
FIG. 15 is a block schematic diagram of a memory module including microelectronic dies with isolation circuits in accordance with an embodiment of the present invention.

FIG. 15 shows one embodiment of a circuit module as a memory module 1500 including isolation circuits similar to those previously described with reference to FIGS. 2-13. Memory module 1500 generally depicts a Single In-line Memory Module (SIMM) or Dual In-line Memory Module (DIMM). A SIMM or DIMM can generally be a printed circuit board (PCB) or other support containing a series of memory devices. While a SIMM will have a single in-line set of contacts or leads, a DIMM will have a set of leads on each side of the support with each set representing separate I/O signals. Memory module 1500 contains multiple memory devices 1510 contained on support 1515, the number depending upon the desired bus width and the desire for parity. Memory module 1500 can contain memory devices 1510 on both sides of support 1515. Memory module 1500 accepts a command signal from an external controller (not shown) on a command link 1520 and provides for data input and data output on data links 1530. The command link 1520 and data links 1530 are connected to leads 1540 extending from the support 1515. Leads 1540 are shown for conceptual purposes and are not limited to the positions shown in FIG. 15.

Figure 16:
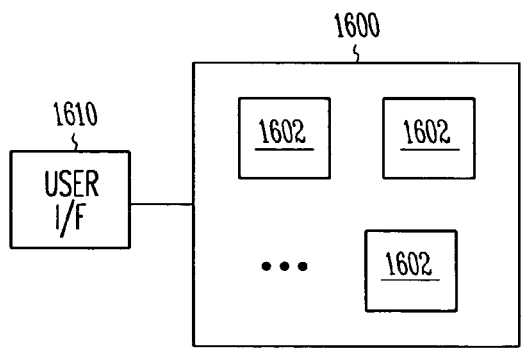
FIG. 16 is a block schematic diagram of an electronic system including a isolation circuit in accordance with another embodiment the present invention.

FIG. 16 shows an electronic system 1600 containing one or more circuit modules 1602 similar to circuit module 1500 (FIG. 15) and including isolation circuits, such as the isolation circuit 1200 of the present invention. Electronic system 1600 generally contains a user interface 1610. User interface 1610 provides a user of the electronic system 1600 with some form of control or observation of the results of the electronic system 1600. Some examples of user interface 1610 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1610 can further describe access ports provided to electronic system 1600. Access ports are used to connect an electronic system to the more tangible user interface components previously exemplified. One or more circuit modules 1602, such as the circuit modules 1500 in FIG. 15, can be a processor providing some form of manipulation, control or direction of inputs from or outputs to user interface 1610, or of other information either preprogrammed into, or otherwise provided to, electronic system 1600. As will be apparent from the lists of examples previously given, electronic system 1600 will often contain certain mechanical components (not shown) in addition to the circuit modules 1602 and user interface 1610. It will be appreciated that the one or more circuit modules 1602 in electronic system 1600 can be replaced by a single integrated circuit. Furthermore, electronic system 1600 can be a sub-component of a larger electronic system.

Figure 17:
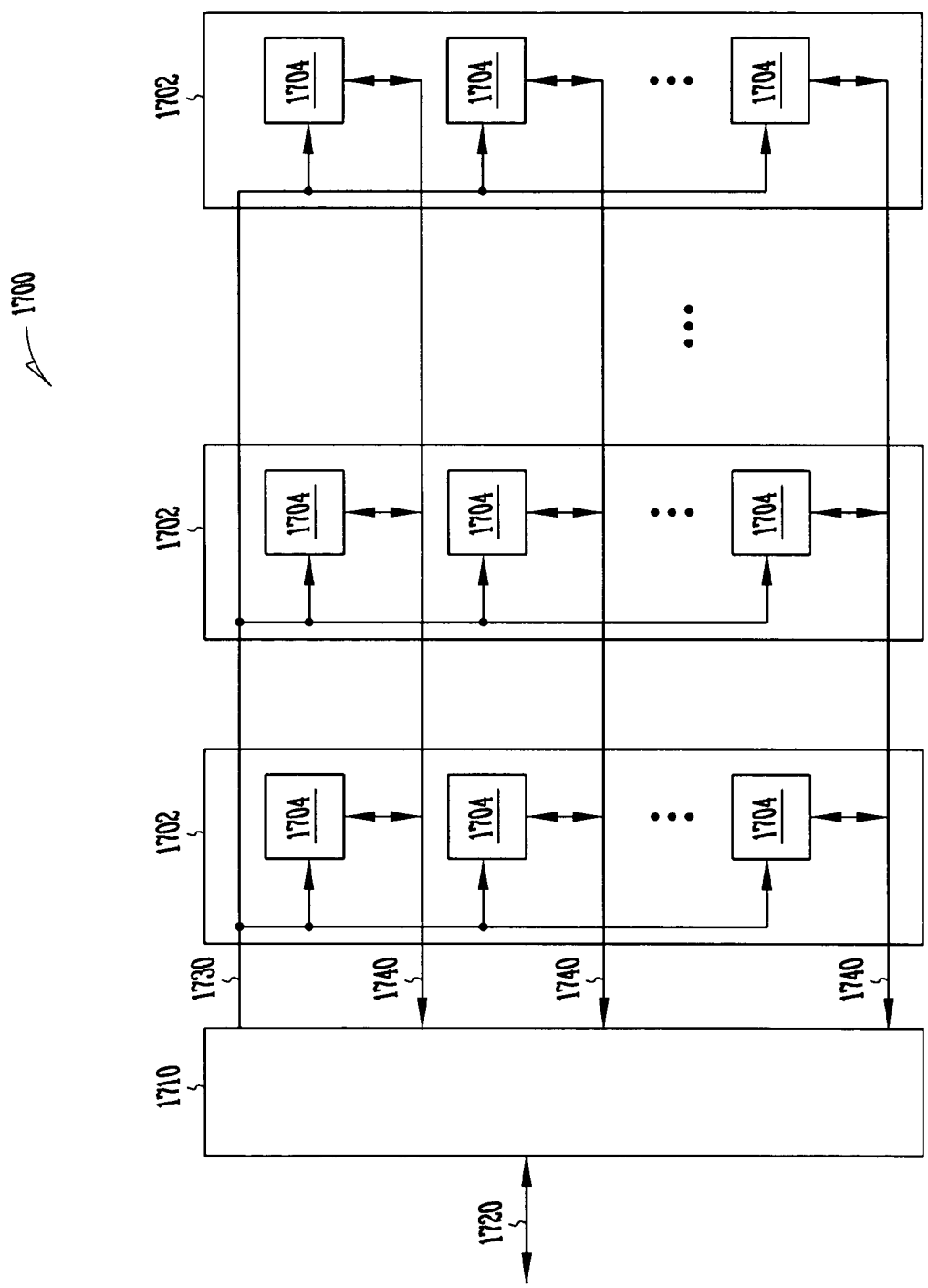
FIG. 17 is a block schematic diagram of a memory system including microelectronic dies with isolation circuits in accordance with an embodiment of the present invention.

FIG. 17 shows one embodiment of an electronic system as memory system 1700. Memory system 1700 contains one or more memory modules 1702 similar to memory modules 1500 in FIG. 15 and including an isolation circuits, such as isolation circuit 1200 in accordance with the present invention. A memory controller 1710 provides and controls a bidirectional interface between memory system 1700 and an external system bus 1720. Memory system 1700 accepts a command signal from the external bus 1720 and relays it to the one or more memory modules 1704 on a command link 1730. Memory system 1700 provides for data input and data output between the one or more memory modules 1704 and external system bus 1720 on data links 1740.

Figure 18:
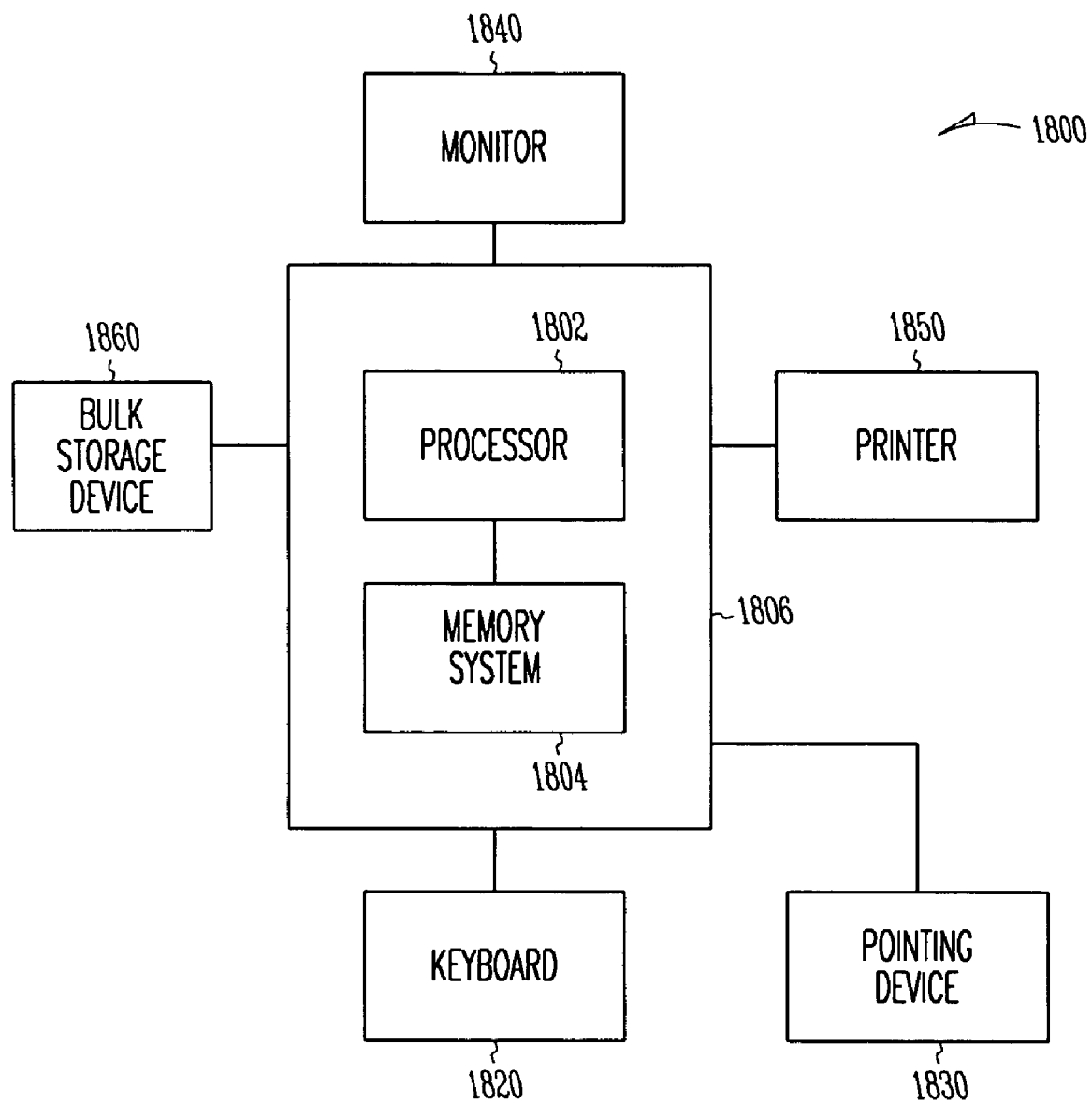
FIG. 18 is a block schematic diagram of a computer system including isolation circuits in accordance with an embodiment of the present invention.

FIG. 18 shows a further embodiment of an electronic system as a computer system 1800. Computer system 1800 contains a processor 1810 and a memory system 1802 similar to memory system 1700 of FIG. 17. The processor 1810 and the memory system 1802 can be housed in a computer unit 1805. Computer system 1800 is but one example of an electronic system containing another electronic system, i.e. memory system 1802. The processor 1810 and the memory system 1802 can include isolation circuits in accordance with the present invention, such as the isolation circuit 1200 in FIG. 12. Computer system 1800 optionally contains user interface components. Depicted in FIG. 18 are a keyboard 1820, a pointing device 1830, a monitor 1840, a printer 1850 and a bulk storage device 1860. It will be appreciated that other components are often associated with the computer system 1800 such as modems, device driver cards, additional storage devices, etc. It will further be appreciated that the processor 1810 and the memory system 1802 of the computer system 1800 can be incorporated on a single integrated circuit and can use the isolation circuits of the present invention.

CONCLUSION

The present invention thus provides a circuit or device to isolate a defective die to prevent a shared signal from being impacted by the defective die and thereby adversely effecting the operation or testing of other dies to which the shared signal is applied. Additionally, the present invention provides a circuit or device to prevent a test pad or other type pad from being coupled to an associated microelectronic die during normal operation of the die or during operation of the die other than when the pad is needed to apply a test signal or another signal. Further, the present invention provides a method for testing multiple dies on a wafer where a defective die cannot adversely effect the testing of other dies sharing a common signal.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A method of making an isolation circuit, comprising:
    forming a first probe pad in one or more scribe lines of a wafer, the first probe pad adapted to receive a control signal from a probe of a test system;
    forming a second probe pad in the one or more scribe lines of the wafer and coupled to each of a plurality of microelectronic dice on the wafer, the second probe pad adapted to receive a test signal from another probe of the test system;
    forming a third pad coupled to a component formed in a first microelectronic die of the plurality of microelectronic dice on the wafer; and
    forming a device in the one or more scribe lines of the wafer, the device coupled to the first probe pad, the second probe pad, and the third pad, the device adapted to selectively transfer the test signal from the second probe pad individually to only the third pad coupled to the component formed in the first microelectronic die in response to the device receiving the control signal from the first probe pad.

2. The method of claim 1, wherein forming the device comprises forming the device as one of a metal oxide semiconductor (MOS) device, a multiplexor, a conductive jumper, and a fuse device.

3. The method of claim 1, wherein forming at least one of the first probe pad and the second probe pad includes forming the first probe pad and the second probe pad in a redistribution layer.

4. The method of claim 1, wherein forming the device includes forming an anti-fuse type device.

5. The method of claim 1, wherein forming a first probe pad in one or more scribe lines of a wafer and forming a second probe pad in the one or more scribe lines of the wafer includes forming the first probe pad in a first scribe line and forming the second probe pad in a second scribe line that is different from the first scribe line.

6. A method of making an isolation circuit, comprising:
    forming a first probe pad in one or more scribe lines of a wafer, the first probe pad to receive a test signal from a probe of a test system;
    forming a second part pad coupled to a component;
    forming a first device in the one or more scribe lines of the wafer, the first device coupled to the first probe pad and the second part pad and adapted to selectively transfer the test signal from the first probe pad to the second part pad in response to the first device receiving a control signal;
    forming a control pad in the one or more scribe lines of the wafer, the control pad coupled to the first device, the control pad operable to receive the control signal and to apply the control signal to the first device; and
    forming a second device coupled to the control pad and to the first device, the second device adapted to selectively prevent the first device from transferring the test signal from the first probe pad to the second part pad.

7. The method of claim 6, further comprising providing a wireless identification circuit to provide the control signal.

8. The method of claim 6, wherein the first device is an N-channel transistor, and the second device selectively connects the gate of the N-channel transistor to ground potential.

9. The method of claim 6, forming the second device includes forming the second device on a mutant die on the wafer.

10. A method of making a microelectronic die, comprising:
    forming a first probe pad in one or more scribe lines, the first probe pad adapted to receive a control signal from a probe of a test system;
    forming a second probe pad in the one or more scribe lines, the second probe pad adapted to receive a test signal from another probe of the test system;
    forming a third pad coupled to a component formed on the microelectronic die; and
    forming a device in the one or more scribe lines, the device coupled to the first probe pad, the second probe pad, and the third pad, the device adapted to selectively transfer the test signal from the second probe pad to the third pad in response to the device receiving the control signal from the first probe pad.

11. The method of claim 10, further comprising:
    forming a second device adapted to selectively prevent the second probe pad from being coupled to the third pad during a predetermined use of the microelectronic die.

12. A method of making a microelectronic die, comprising:
    forming a first probe pad in one or more scribe lines, the first probe pad to receive a test signal from a probe of a test system;
    forming a second pad in the one or more scribe lines, the second pad coupled to a component;
    forming a first device coupled to the first probe pad and the second pad, the first device adapted to selectively transfer the test signal from the first probe pad to the second pad in response to a control signal; and
    forming a second device to selectively prevent the first device from transferring the test signal from the first probe pad to the second pad;

wherein forming the first device and the second device includes forming at least one of the first device and the second device on a sacrifice die.

13. A method of making an electronic system, comprising:
forming a processor; and
forming a memory system coupled to the processor, wherein at least one of the processor and the memory system are formed on a microelectronic die including an isolation circuit and wherein forming the isolation circuit includes:
   forming a first probe pad in one or more scribe lines of a wafer, the first probe pad adapted to receive a control signal from a probe of a test system;
   forming a second probe pad in the one or more scribe lines of the wafer, the second probe pad adapted to receive a test signal from another probe of the test system;
   forming a third pad coupled to one of the processor and the memory system; and
   forming a first device in the one or more scribe lines of the wafer, the first device coupled to the first probe pad, the second probe pad, and the third pad, the first device adapted to selectively transfer the test signal from the second robe pad to only the third pad in response to the first device receiving the control signal from the first probe pad.

14. The method of claim 13, further comprising forming a second device adapted to selectively prevent the first device from selectively transferring the test signal from the second probe pad to the third pad during a predetermined use of the electronic system.

15. The method of claim 13, wherein forming the first probe pad in one or more scribe lines of a wafer and forming the second probe pad in the one or more scribe lines of the wafer includes forming the first probe pad in a first scribe line and forming the second probe pad in a second scribe line that is different from the first scribe line.

16. A method of making an electronic system, comprising:
forming a processor; and
forming a memory system coupled to the processor, wherein at least one of the processor and the memory system are formed on a microelectronic die including an isolation circuit and wherein forming the isolation circuit includes:
   forming a first probe pad in one or more scribe lines, the first probe pad to receive a test signal from a probe of a test system;
   forming a second probe pad in the one or more scribe lines, the second probe pad coupled to one of the processor and the memory system;
   forming a first device adapted to selectively transfer the test signal from the first probe pad to the second probe pad in response to a control signal; and
   forming a second device to selectively prevent the the first device from selectively transferring the test signal from the first probe pad to the second probe pad;
   wherein forming the first device and the second device includes forming at least one of the first device and the second device on a sacrifice die.

17. The method of claim 16, wherein forming the first probe pad in one or more scribe lines of a wafer and forming the second probe pad in the one or more scribe lines of the wafer includes forming the first probe pad in a first scribe line and forming the second probe pad in a second scribe line that is different from the first scribe line.

18. A method, comprising:
determining if any microelectronic dies of a plurality of microelectronic dies formed on a semiconductor wafer are defective;
applying a test signal to a test probe pad associated with each of the plurality of microelectronic dies, the test probe pad operable to receive the test signal from a probe of a tester system;
operating a device associated with each microelectronic die to transfer the test signal from the test probe pad to a further pad if the microelectronic die is good, wherein the further pad is connected to the microelectronic die; and
preventing the test signal from being applied to the microelectronic die if the die is defective by applying a control signal to the device through a control probe pad, the control probe pad being coupled to the device associated with the defective die, the control probe pad operable to receive the control signal from another probe of the tester system;
wherein the test probe pad, the control probe pad, and the device associated with each microelectronic die are formed in one or more scribe lines on the semiconductor wafer.

19. The method of claim 18, wherein operating the device comprises one of:
sending a gate signal to operate a MOS transistor;
sending a signal to operate a multiplexor;
forming a conductive jumper; and
operating an anti-fuse device.

20. The method of claim 18, wherein preventing the test signal from being applied to the microelectronic die comprises one of:
sending a gate signal to prevent a MOS transistor from operating;
operating a fuse device; and
operating a multiplexor to prevent the test pad from being coupled to the further pad.

21. The method of claim 18, further comprising:
receiving a radio frequency signal to operate the device if the microelectronic die is good.

22. The method of claim 18, wherein the further pad is a part pad.

23. A method, comprising:
determining if any microelectronic dies of a plurality of microelectronic dies formed on a semiconductor wafer are defective;
applying a test signal to a test probe pad associated with each of the microelectronic dies, the test probe pad operable to receive the test signal from a probe of a tester system;
operating a device associated with each microelectronic die to transfer the test signal from the test probe pad to a further pad associated with each microelectronic die if the microelectronic die is good, wherein the further pad is connected to the microelectronic die;
preventing the test signal from being applied to the microelectronic die if the die is defective by applying a control signal to the device through a control probe pad, the control probe pad being coupled to the device associated with the defective die, the control probe pad operable to receive the control signal from another probe of the tester system; and
preventing the device from transferring the test signal to each associated further pad during a selected use of the microelectronic die;

wherein the test probe pad, the control probe pad, and the device associated with each microelectronic die are formed in one or more scribe lines on the semiconductor wafer.

24. The method of claim 23, wherein the device is an N-channel transistor and wherein preventing each test probe pad from transferring the test signal to each associated further pad comprises grounding a gate of the N-channel transistor.

25. The method of claim 23, wherein the device is a P-channel transistor and wherein preventing each test probe pad from being coupled to each associated further pad comprises applying a high signal to a gate of the P-channel transistor.

26. The method of claim 23, wherein the further pad is a part pad.

* * * * *

UNITED STATES PATENT AND TRADEMARK OFFICE
CERTIFICATE OF CORRECTION

| | | |
|---|---|---|
| PATENT NO. | : 7,378,290 B2 | Page 1 of 1 |
| APPLICATION NO. | : 10/929898 | |
| DATED | : May 27, 2008 | |
| INVENTOR(S) | : Cowles et al. | |

It is certified that error appears in the above-identified patent and that said Letters Patent is hereby corrected as shown below:

In column 15, line 24, in Claim 13, delete "robe" and insert -- probe --, therefor.

In column 15, line 54, in Claim 16, after "prevent the" delete "the".

Signed and Sealed this

Twenty-sixth Day of August, 2008

JON W. DUDAS
*Director of the United States Patent and Trademark Office*